United States Patent [19]

Borodovsky

[11] Patent Number: 4,529,685
[45] Date of Patent: Jul. 16, 1985

[54] METHOD FOR MAKING INTEGRATED CIRCUIT DEVICES USING A LAYER OF INDIUM ARSENIDE AS AN ANTIREFLECTIVE COATING

[75] Inventor: Yan A. Borodovsky, Fremont, Calif.

[73] Assignee: Advanced Micro Devices, Inc., Sunnyvale, Calif.

[21] Appl. No.: 585,808

[22] Filed: Mar. 2, 1984

[51] Int. Cl.³ .................................. G03C 5/00
[52] U.S. Cl. .................................. 430/311; 430/313; 430/319; 430/327; 430/329
[58] Field of Search .............. 430/271, 276, 325, 326, 430/513, 327, 311, 313, 319, 329

[56] References Cited

U.S. PATENT DOCUMENTS

| 3,720,143 | 3/1973 | Hashimoto et al. | 430/319 X |
| 3,884,698 | 5/1975 | Kakihama et al. | 430/276 X |
| 4,102,683 | 7/1978 | DiPiazza | 430/319 |
| 4,311,784 | 1/1982 | Fan | 430/271 |
| 4,357,416 | 11/1982 | Fan | 430/302 |
| 4,362,809 | 12/1982 | Chen et al. | 430/312 |
| 4,370,405 | 1/1983 | O'Toole et al. | 430/312 |
| 4,414,314 | 11/1983 | Kaplan et al. | 430/311 |

OTHER PUBLICATIONS

Sadagopan, "Anti-Interference and Antireflection Coatings . . . ," IBM Tech. Disclosure Bulletin, vol. 14(3) Aug. 1971, pp. 795-796.
Brewer et al., "Reduction of Standing-Wave Effect . . . ," J. Applied Photographic Eng., vol. 7(6) Dec. 1981, pp. 184-186.

Primary Examiner—John E. Kittle
Assistant Examiner—José G. Dees
Attorney, Agent, or Firm—Patrick T. King; John P. Taylor; J. Vincent Tortolano

[57] ABSTRACT

An improved method for making an integrated circuit device is disclosed which comprises coating a reflective layer with an antireflective coating comprising a layer of indium arsenide before applying a layer of photosensitive material or photoresist during production of the device. Light passing through the photosensitive material is absorbed by the antireflective coating so that only the minor amount of light required for alignment is reflected back through the photosensitive material resulting in sharper pattern definition in the photoresistive material and better process control overall. The antireflective indium arsenide layer is applied in a thickness of at least 500 angstroms and is further characterized by an 10 to 25% reflectivity relatively independent of coating thickness and wave length of light in the frequency range normally used to expose photoresist material.

17 Claims, 5 Drawing Figures

METHOD FOR MAKING INTEGRATED CIRCUIT DEVICES USING A LAYER OF INDIUM ARSENIDE AS AN ANTIREFLECTIVE COATING

BACKGROUND OF THE INVENTION

1. Field of the Invention

This invention relates to the production of integrated circuit devices. More particularly, this invention relates to the use of indium arsenide as an antireflective coating which will enhance the quality of photolithography used in the production of integrated circuit devices.

2. Description of the Prior Art

The exposure of photosensitive material or photoresist placed over a reflective surface, such as metal, silicon, or poly silicon, etc., produces partial exposure of the photoresist in nondesirable areas due to the diffusive scattering of reflected light and interference effects if illumination is monochromatic.

One approach to minimize this problem is to place a layer of a material with a known refractive index on the surface beneath the photoresist to change the amplitude of the reflected light to a minimum at the photoresist/antireflective coating interface. If refractive indices and thicknesses of underlying layers are known, it is possible to calculate the required thickness of the layer to produce destractive interference on the interface of this layer and the above photoresist layer which will effectively reduce such undesirable effects. The established thickness of this layer would have to be tightly controlled to achieve the conditions of destractive interference.

It has also been proposed to use an organic dye which would absorb the light passing through the photoresist. However, application of the dye to the reflective surface as a coating followed by drying and baking of the coating is complicated by the sensitivity of the dye to heat as well as a thickness dependency of the organic coating.

Antireflective coatings made using titanium, tungsten, or molybdenum disilicide have also been successfully used as antireflective coatings. These coatings act as absorption agents, thus reducing the amplitude of the light reflected back to the photoresist. However, the reflectivity of these coating materials itself is relatively high, i.e., About 50%, and tends to increase to 85% as the wave length decreases in the ultraviolet region.

There, therefore, remains a need for an antireflective coating having a lower reflectivity and high absorptivity in the photoresist operating wavelength range which may be applied to a surface of higher reflectivity with good adherence characteristics, and which also will permit adherence thereto by a photoresistive coating placed thereon. Further, it should have some minor amount of reflectivity, i.e., about 10 to 25%, to enable optical alignment to alignment marks in lower layers to assure alignment of subsequent mask patterns placed thereon.

SUMMARY OF THE INVENTION

It is therefore an object of the invention to provide an improved method for making integrated circuit devices using an antireflective coating which may be applied to a surface of higher reflectance beneath a photosensitive material.

It is another object of the invention to provide an improved method for making integrated circuit devices using an antireflective coating material over a reflective surface beneath a photosensitive layer which will have strong absorption characteristics over a wide frequency of light, including the ultraviolet.

It is a further object of the invention to provide an improved method for making integrated circuit devices using an antireflective coating applied over a surface of higher reflectance beneath a layer of photosensitive material wherein the antireflective coating layer has a reflectivity of about 10 to 25% to permit a sufficient amount of reflected light to pass through the photoresist back to the exposing equipment permit optical alignment of subsequent masked patterns with underlying optical reference marks on or below the surface of the highly reflective material.

These and other objects of the invention will be apparent from the accompanying drawings and description.

In accordance with the invention, an improved method for making an integrated circuit device comprises coating a reflective layer with an antireflective coating comprising a layer of indium arsenide before applying a layer of photosensitive material during production of the device to thereby absorb light passing through the photosensitive material whereby only the minor amount of light required for alignment is reflected back through the photoresist material resulting in sharper pattern definition in the photoresistive material and better process control overall. The antireflective indium arsenide layer is further characterized by an 10 to 25% reflectivity relatively independent of coating thickness and wave length of light in the frequency range normally used to expose photoresists.

DESCRIPTION OF THE PREFERRED EMBODIMENTS

Figure 1:
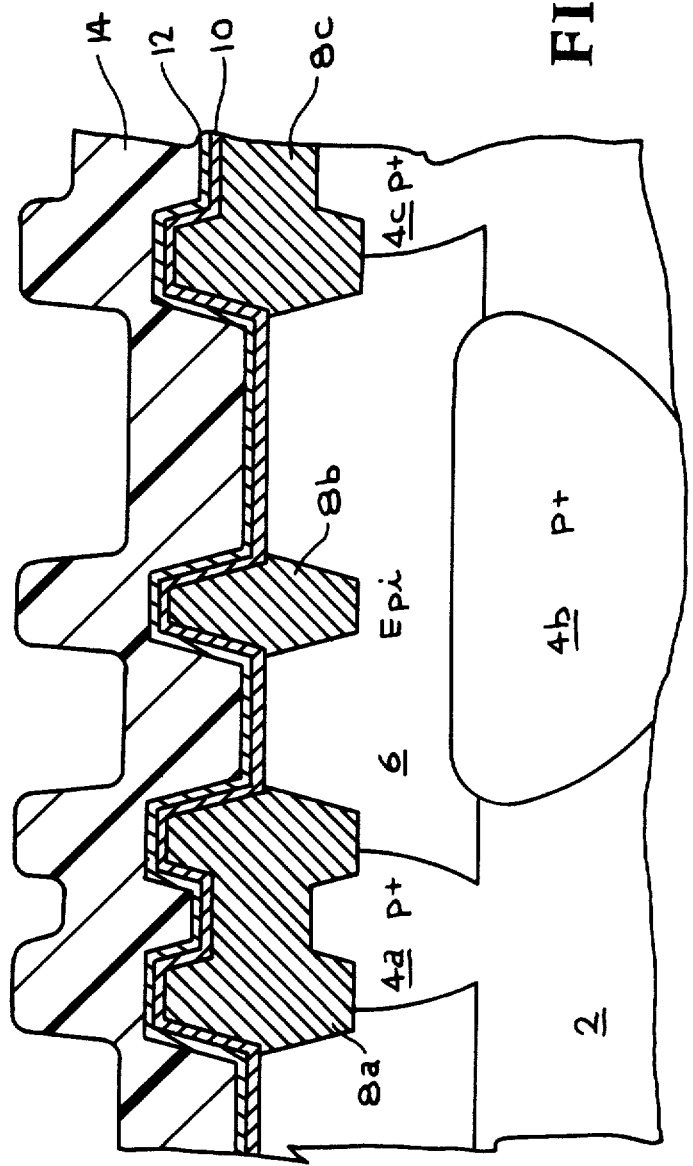
FIG. 1 is a cross sectional view of a segment of an integrated circuit device in an early stage of construction showing the use of the antireflective coating thereon.
Figure 2:
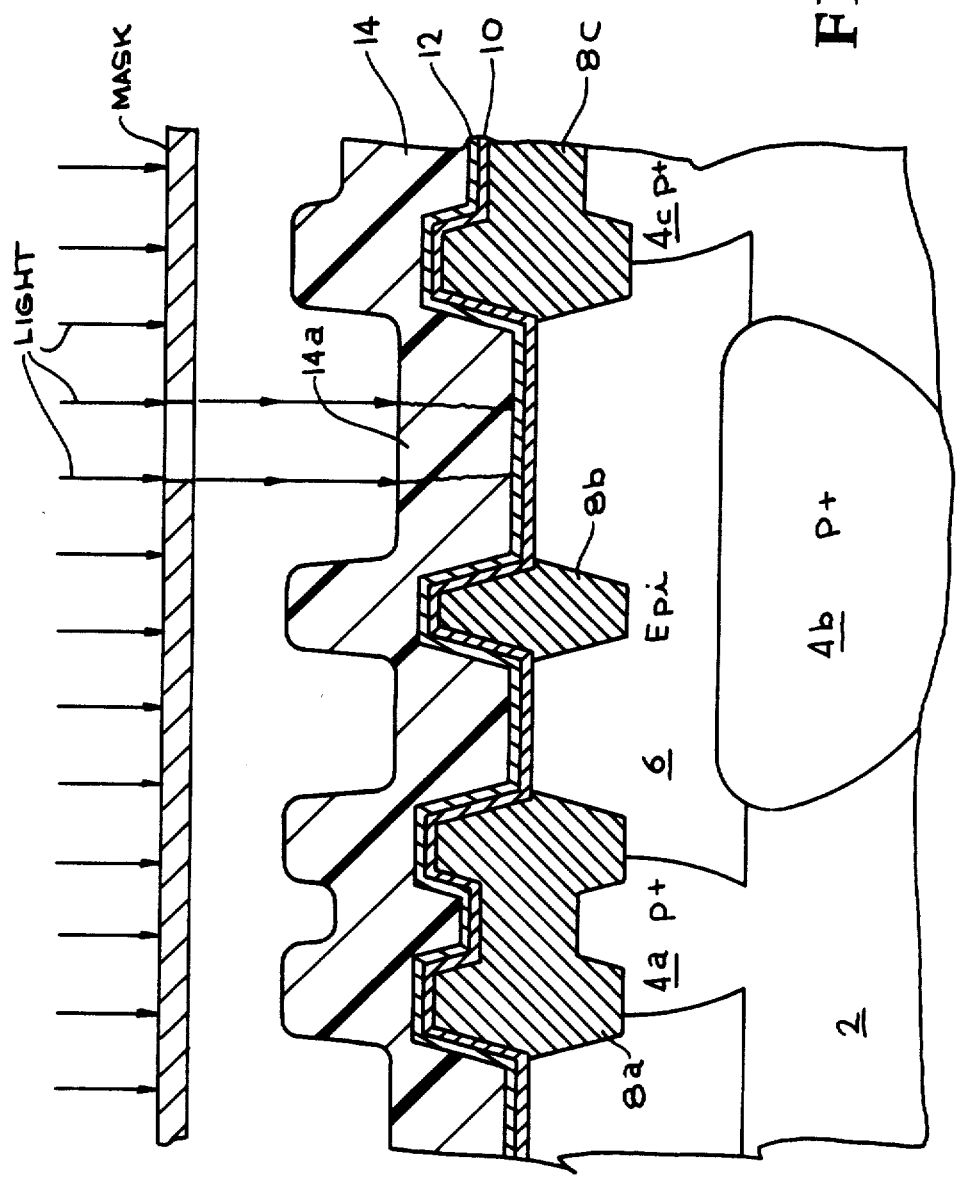
FIG. 2 is a cross sectional view illustrating the segment shown in FIG. 1 being exposed to a light pattern.
Figure 3A:
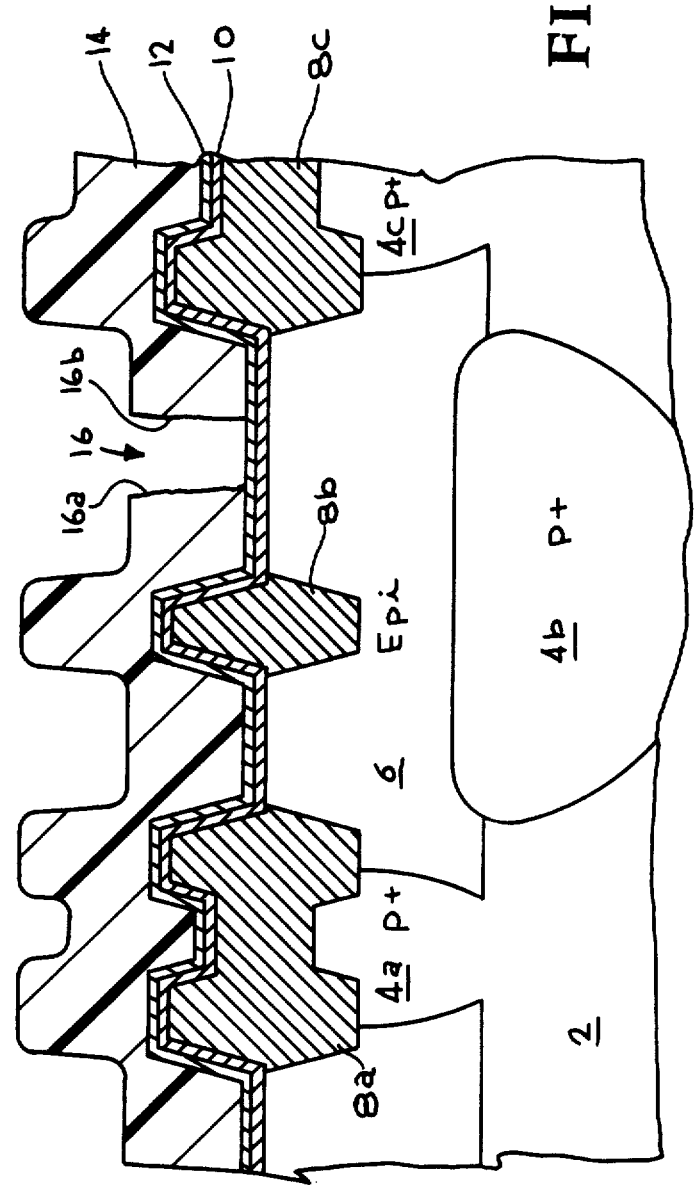
FIG. 3A is a cross sectional view of a prior art structure at the same stage of construction as shown in FIG. 3.
Figure 3B:
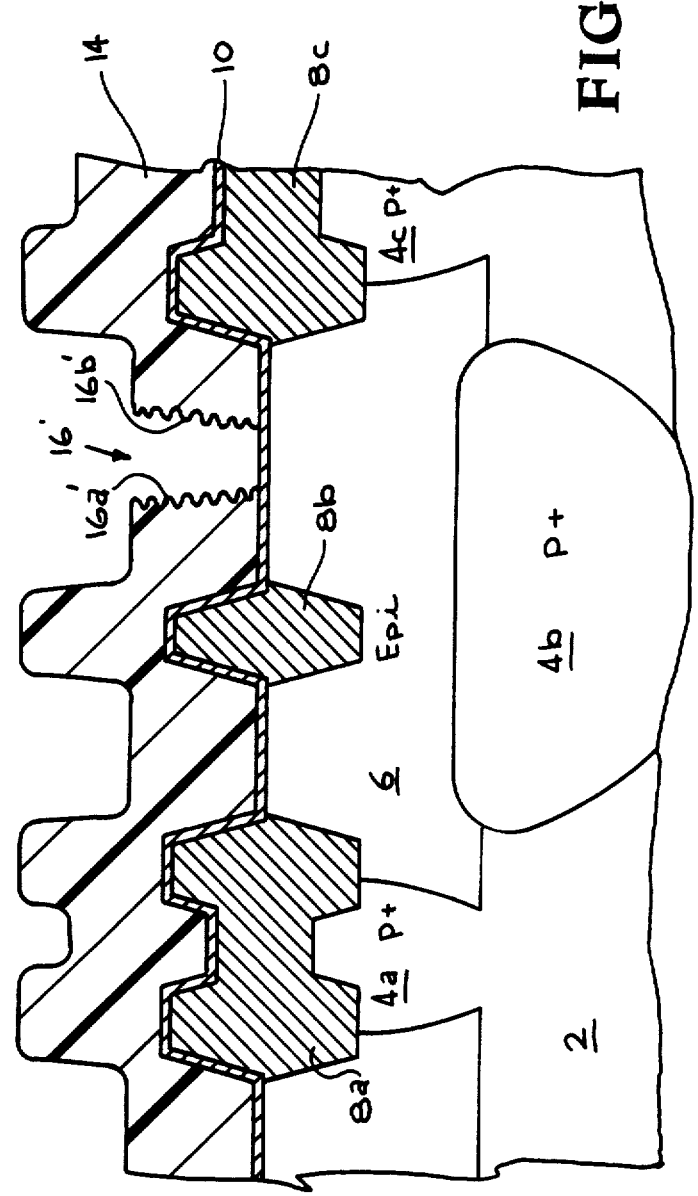
FIG. 3 is a cross sectional view illustrating the segment shown in FIG. 1 after development of the exposed portions of the photoresist material.

Referring now to FIGS. 1-3, the invention will be illustrated in a simplified form. In FIG. 1, a silicon substrate 2 is shown which already has been sujected to several processing steps as shown to provide doped 4a, 4b, and 4c, an epitaxial layer 6, and oxide portions 8a, 8b, and 8c. Over epitaxial layer 6, a reflective layer 10 of poly silicon has been deposited. In accordance with the invention, an antireflective coating 12 of indium arsenide is applied over reflective layer 10, for example, by sputtering, to a thickness of at least 500 angstroms. A layer 14 of positive photosensitive material or "positive photoresist" is then applied over the antireflective indium arsenide coating.

As shown in FIG. 2, the photoresist layer 14 is then exposed to a light pattern which selectively photopolymerizes portion 14a of photoresist layer 14. During this exposure, the majority of the light passing through portion 14a of photoresist layer 14 is absorbed by antireflective indium arsenide coating 12, effectively preventing the transmission, to the reflective surface of the underlying reflective layer 10, of most of the light shining on portion 14a of layer 14. By absorbing most of this light, very little light may be reflected by the reflective surface of layer 10 back to, and through photoresist layer 14. Light scattering, standing waves, or optical fringes are thereby minimized, resulting in a sharper definition between exposed portion 14a and the unexposed portions of photoresist material 14.

This is seen in FIG. 3 wherein portion 14a of photoresist layer 14 which was exposed to light has been removed by developing photoresist material 14 leaving sharply defined edges 16a and 16b at opening 16 between the developed and undeveloped portions of the coating.

In contrast, prior art FIG. 3A shows the development of the same photoresist material exposed to light in the same manner, but without the use of intervening antireflective coating 12 of the invention over reflective layer 10. In this instance the light waves were reflected back by layer 10 into the photoresist material 14' causing standing waves in the photoresist material resulting in an inwardly tapered opening 16' having jagged edges 16a' and 16b' after development.

After development of photoresist coating 14 to form opening 16, indium arsenide in the area under opening 16 is removed to expose the underlying reflective surface, e.g., the poly silicon. For this purpose, the indium arsenide may be selectively etched away without damage to adjoining materials by treating with a solution of 1 volume part bromine in 100 volume parts acetic acid and 100 volume parts of water. Alternatively, the indium arsenide may be removed in the area underneath opening 16 by a dry etch such as Reactive Ion Etching.

After the completion of etching of the underlying poly silicon layer through the opening in the indium arsenide, the remainder of the photoresist coating may be removed followed by removal of the remainder of the indium arsenide using one of the same methods of removal just discussed.

Figure 4:
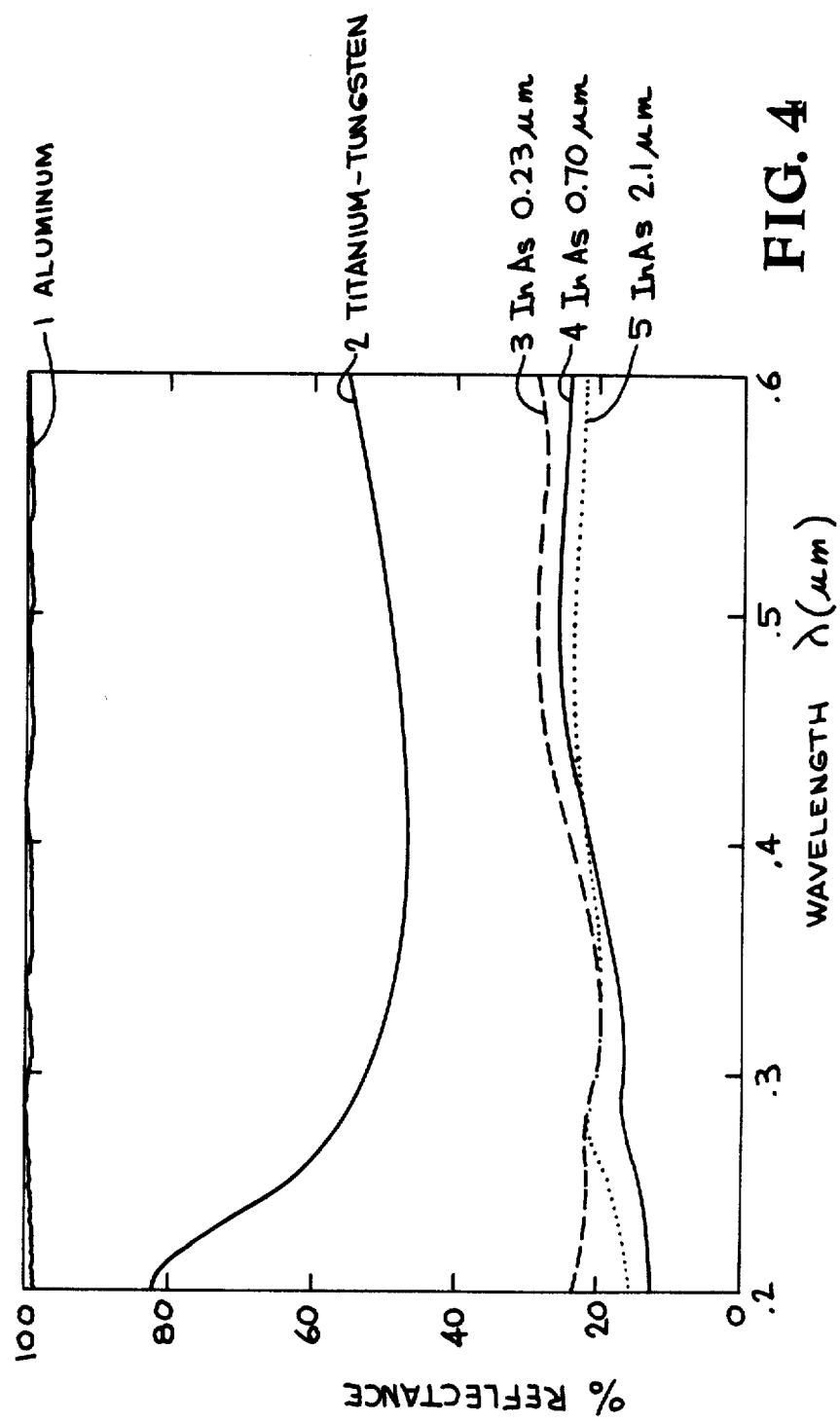
FIG. 4 is a graph showing the reflectivity characteristics of the coating of the invention at various coating thicknesses compared to a prior art coating and a highly reflective material.

The antireflective indium arsenide coating of the invention should be at least 500 angstroms thick to insure sufficient absoption of the light to prevent reflectance of 75 to 90% of the light passing through the photoresist layer. The coating thickness above this minimum may vary considerably without any noticeable variation in absorption as shown in the graph of FIG. 4 wherein coatings of 0.23, 0.7, and 2.1 microns are plotted. However, the coating should be capable of reflecting sufficient light, i.e., about 10-25%, to permit alignment devices associated with the photomasking equipment to orient the light pattern with underlying alignment marks in the integrated circuit device.

The indium arsenide may be applied over various underlying materials having more reflective surfaces such as, for example, aluminum, silicon, and polysilicon. The indium arsenide not only adheres well to such underlying surfaces, but provides an adequate bond to photoresist material coated over the indium arsenide.

The indium arsenide is conveniently applied to the reflective surface by sputtering. Other methods of application of the indium arsenide may also be used provided they do not interfere with the other materials already present on the integrated circuit structure.

The indium arsenide may be used as an antireflective coating under negative photo resist as well as the positive photo resist illustrated in the drawings. As in the useage with positive photo resist, if used under negative photo resist, the portion of the indium arsenide layer, uncovered after development of the negative photo resist, will be selectively removed to permit treatment, such as etching, of the underlying surface.

In the graph of FIG. 4, reflectivity is plotted against wavelength in the 200-600 nanometer range for several materials. Line 1, representing a metal such as aluminum, shows almost total reflectivity, while line 2, representing a prior art antireflective coating (titanium-tungsten) begins to lose its antireflective properties below 300 nanometers. Lines 3-5, which represent the indium arsenide antireflective coating used in the invention at various coating thicknesses, illustrates a consistency of low reflectivity for indium arsenide over the entire range of 200-600 nanometers. It will be noted, that not only is the indium arsenide reflectivity lower than the illustrated prior art titanium-tungsten coating, but it does not taper off in the 200-300 nanometer range as does the titanium-tungsten coating, thus permitting useage of a wider range of ultraviolet wavelengths to expose the photoresist material.

Thus the invention provides an improved method for constructing an integrated circuit device having sharper pattern definition and overall process control in the use of photoresist layers over reflective surfaces wherein the use of an antireflective coating of indium arsenide over the reflective surface results in more sharply defined patterns formed in photosensitive materials exposed to light shining through a mask to form the openings. The antireflective coating functions well over a wide range of coating thicknesses and is relatively independent of the wavelength of light in the frequency range normally used to expose photoresist material.

Having thus described the invention, what is claimed is:

1. In the method of manufacturing an integrated circuit device having a plurality of layers wherein a layer of photosensitive material is selectively exposed to a pattern of light transmitted through an optical mask during construction of said device, the improvement comprising:
   a. applying an antireflective coating of indium arsenide on the surface of a reflective layer;
   b. applying a photosensitive layer over said indium arsenide coating; and
   c. exposing said photosensitive layer to a pattern of light whereby the creation of interference fringes in said photosensitive layer will be minimized as well as minimizing undesired exposure of the photosensitive material in areas not intended to be exposed, whereby the resolution of the exposure pattern in said photosensitive layer when subsequently developed will be enhanced thereby providing better overall process control.

2. The method of claim 1 wherein said indium arsenide coating is applied to said reflective surface by sputtering.

3. The method of claim 1 wherein said antireflective indium arsenide coating is applied in a thickness of at least 500 angstroms to provide sufficient absorption of monochromatic light used to exposed said photosensitive layer to inhibit formation of interference fringes and light scattering whereby the definition of the pattern transfered from a photomask to a photosensitive layer, placed over said indium arsenide coating during production of said device, is enhanced.

4. The method of claim 1 wherein said antireflective indium arsenide coating is applied in a thickness of from 500 to 4000 Angstroms whereby said coating will be characterized by a reflectivity which is relatively constant independent of coating thickness.

5. The method of claim 1 wherein the step of exposing said photosensitive layer to a pattern of light includes the use of light of 2000 to 6000 Angstrom wavelength to selectively develop portions of said photosensitive material corresponding to the light pattern superimposed thereon.

6. The method of claim 1 wherein one or more of said plurality of layers is further provided with optical alignment marks at or beneath said reflective surface; said indium arsenide coating layer has a reflectivity of from 10 to 25%; and said method includes the step of orienting the light pattern to which said photosensitive layer is exposed with said alignment marks to provide proper registration for the application of subsequent layers on said integrated circuit device.

7. The method of claim 1 wherein said indium arsenide layer is subsequently selectively removed to produce a pattern corresponding to the pattern developed on said photosensitive material.

8. The method of claim 7 wherein said indium arsenide is selectively removed by an aqueous solution of bromine and acetic acid whereby other layers are not damaged by said removal.

9. The method of claim 8 wherein the remainder of said indium arsenide is subsequently removed from said reflective surface.

10. The method of claim 8 wherein the underlying reflective layer is subsequently treated to produce the desired pattern.

11. The method of claim 8 wherein said photosensitive material comprises positive photoresist and those portions of said photoresist and underlying indium arsenide corresponding to areas exposed to light are selectively removed.

12. The method of claim 8 wherein said phptosensitive material comprises negative photoresist and those portions of said photoresist and underlying indium arsenide corresponding to areas not exposed to light are selectively removed.

13. An improved method for manufacturing an integrated circuit device, the improvement comprising the steps of:
   a. applying an antireflective coating of indium arsenide to a reflective surface;
   b. applying a photosensitive material over said indium arsenide;
   c. selectively exposing said photosensitive material to a pattern of light;
   d. developing said photosensitive material to remove those portions exposed to light;
   e. removing the corresponding portion of said indium arsenide through the openings in said photosensitive material; and
   f. thereafter removing a corresponding portion of the underlying layer through said openings in said indium arsenide layer.

14. The method of claim 13 wherein said layer of indium arsenide is applied in a thickness of at least 500 angstroms.

15. The method of claim 13 wherein light having a wavelength of from 2000 to 6000 angstroms is used to selectively expose said photosensitive material.

16. The method of claim 13 including the further steps of removing the remainder of said photosensitive material followed by removal of the remaining indium arsenide.

17. The method of claim 13 wherein a solution of 1 volume part bromine in 100 volume parts acetic acid and 100 volume parts water is used to remove said indium arsenide.

* * * * *